(12) United States Patent
Inoue et al.

(10) Patent No.: US 6,311,767 B1
(45) Date of Patent: *Nov. 6, 2001

(54) COMPUTER FAN ASSEMBLY

(75) Inventors: Shuji Inoue, Ibaraki-ken; Toshiki Ogawara; Michinori Watanabe, both of Nagano-ken, all of (JP)

(73) Assignee: Intel Corporation, Santa Clara, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 15 days.

(21) Appl. No.: 09/320,011

(22) Filed: May 26, 1999

(51) Int. Cl.[7] ............... F28F 7/00; F28D 15/00; H05R 7/20; H01L 23/34

(52) U.S. Cl. ............ 165/80.4; 165/80.3; 165/104.33; 361/700; 361/697; 257/715

(58) Field of Search ............... 165/80.4, 80.3, 165/104.33, 185; 361/700, 697; 257/715, 722; 174/15.2

(56) References Cited

U.S. PATENT DOCUMENTS

| 5,690,468 | * | 11/1997 | Hong | 165/80.3 |
| 5,760,333 | * | 6/1998 | Kitahara et al. | 165/80.3 |
| 5,828,551 | * | 10/1998 | Hoshino et al. | 361/697 |
| 5,867,365 | * | 2/1999 | Chiou | 361/697 |
| 6,043,980 | * | 3/2000 | Katsui | 165/80.3 |
| 6,163,073 | * | 12/2000 | Patel | 165/80.3 |

FOREIGN PATENT DOCUMENTS

| 10092990A | * | 4/1998 | (JP) . |
| 11153099A | * | 6/1999 | (JP) . |

* cited by examiner

*Primary Examiner*—Marrin M. Lateef
*Assistant Examiner*—Tho V Duong
(74) *Attorney, Agent, or Firm*—Blakely, Sokoloff, Taylor & Zafman LLP

(57) ABSTRACT

A computer fan assembly is described which may be constructed so as to be suitable for use in enclosures for notebook computers or laptops. A heat pipe may be secured to a housing of the computer fan assembly. The heat pipe may be located in a position so that heat is transferred away from the heat pipe by air passing through the housing. Heat may, for example, be conducted from the heat pipe and then convected by means of fins to the air passing through the housing.

8 Claims, 6 Drawing Sheets

COMPUTER FAN ASSEMBLY

BACKGROUND OF THE INVENTION

1). Field of the Invention

The present invention relates to a computer fan assembly.

2). Discussion of Related Art

A computer generally speaking has an enclosure and a number of electrical devices located within the enclosure. Some of these devices, such as the central processing unit, generate heat which increases the temperature. In order to ensure proper working of the computer it may be necessary to cool these devices.

Most computers have a heat sink thermally coupled to the central processing unit. A plurality of fins are located on the heat sink which serve to convect heat, received from the central processing unit, to air located within the enclosure.

A computer fan assembly usually provides for circulation of air through the enclosure. Certain desktop computers, for example, have an enclosure and a computer fan assembly located over an opening in a wall of the enclosure. Air usually enters a computer fan assembly for a desktop computer and exits the assembly in the same direction. Smaller computers such as notebook computers or laptops have enclosures which are much more confined than enclosures for desktop computers, and fan assemblies which are specifically designed to fit within the confines of the enclosures. A computer fan assembly for a notebook computer or a laptop usually has inlet and outlet ports which are positioned relative to one another so that air enters a housing of the computer fan assembly in a downwardly direction and exits the housing in a sideways direction.

Some desktop computers, in addition to having a computer fan assembly, also have a heat pipe having one end secured to a heat sink which receives heat flux from another device such as a central processing unit. An opposing end of the heat pipe is mounted adjacent to an inlet port of the computer fan assembly. Heat generated by the central processing unit is transferred by the heat pipe to the location adjacent the fan. The heat is removed from the heat pipe by the flow of air generated by the fan.

A construction such as found in desktop computers may not be appropriate for notebook computers or laptops due to the confined spaces found within enclosures of such notebook computers and laptops, or due to the need for more efficient removal of heat.

SUMMARY OF THE INVENTION

A computer fan assembly comprising a housing, a fan and a heat pipe. The housing has an inlet port and an outlet port. The fan is rotatably mounted to the housing so that rotation of the fan causes air to enter the housing through the inlet port, pass through the housing, and exit the housing through the outlet port. The heat pipe is secured in intimate contact with the housing.

BRIEF DESCRIPTION OF THE DRAWINGS

The present invention is illustrated by way of examples and not limitation in the figures of the accompanying drawings, in which like references indicate similar elements and in which.

DETAILED DESCRIPTION OF THE INVENTION

A computer fan assembly is described which may be constructed so as to be suitable for use in enclosures for notebook computers or laptops. A heat pipe may be secured to a housing of the computer fan assembly. The heat pipe may be located in a position so that heat is transferred away from the heat pipe by air passing through the housing. Heat may, for example, be conducted from the heat pipe and then convected by means of fins to the air passing through the housing.

Figure 1:
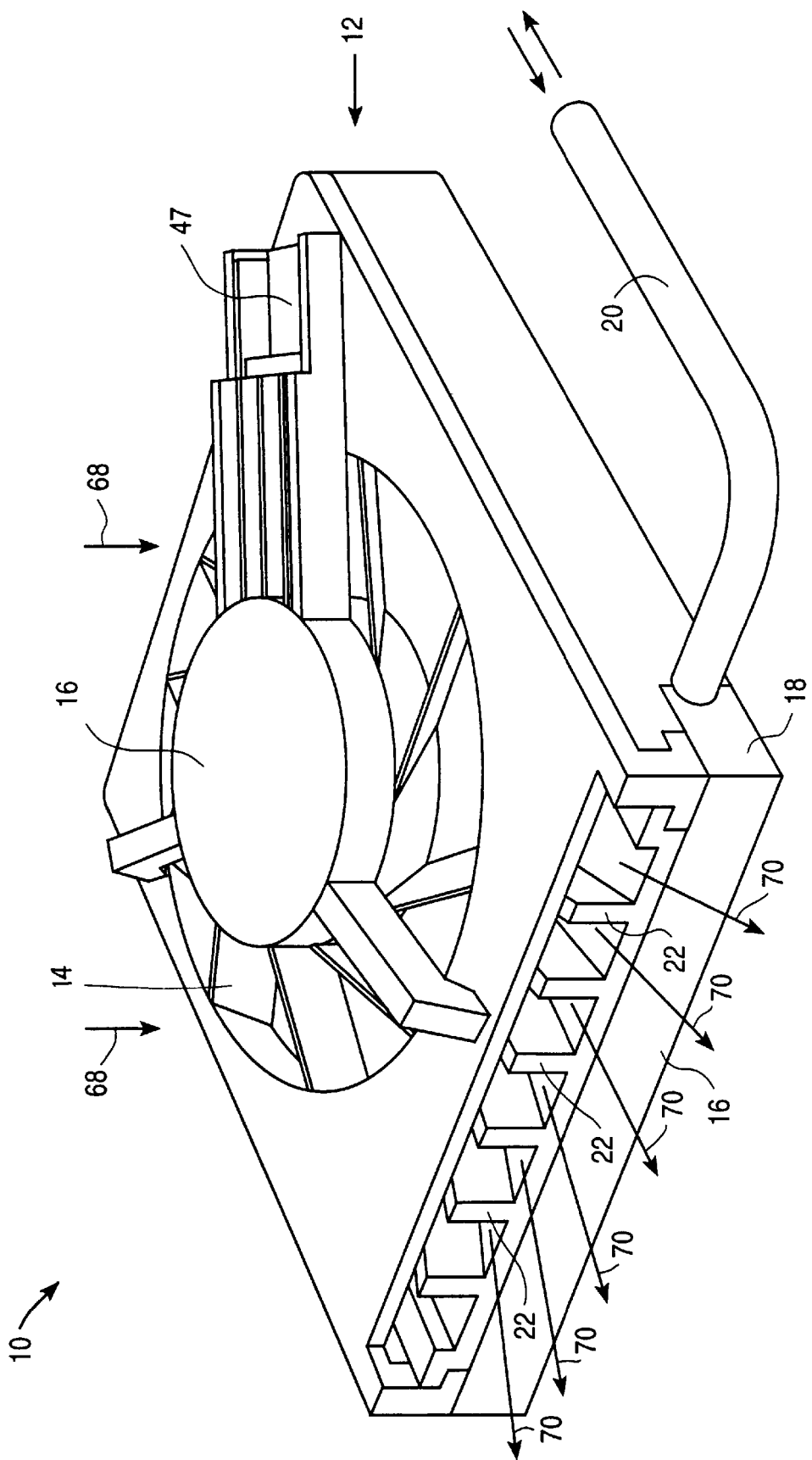
FIG. 1 is a perspective view of a computer fan assembly according to an embodiment of the invention.

FIG. 1 of the accompanying drawings illustrates a computer fan assembly 10, according to an embodiment of the invention, which includes a body 12, a fan 14, an electric motor 16, a retaining block 18, a heat pipe 20, and a plurality of fins 22.

Figure 2:
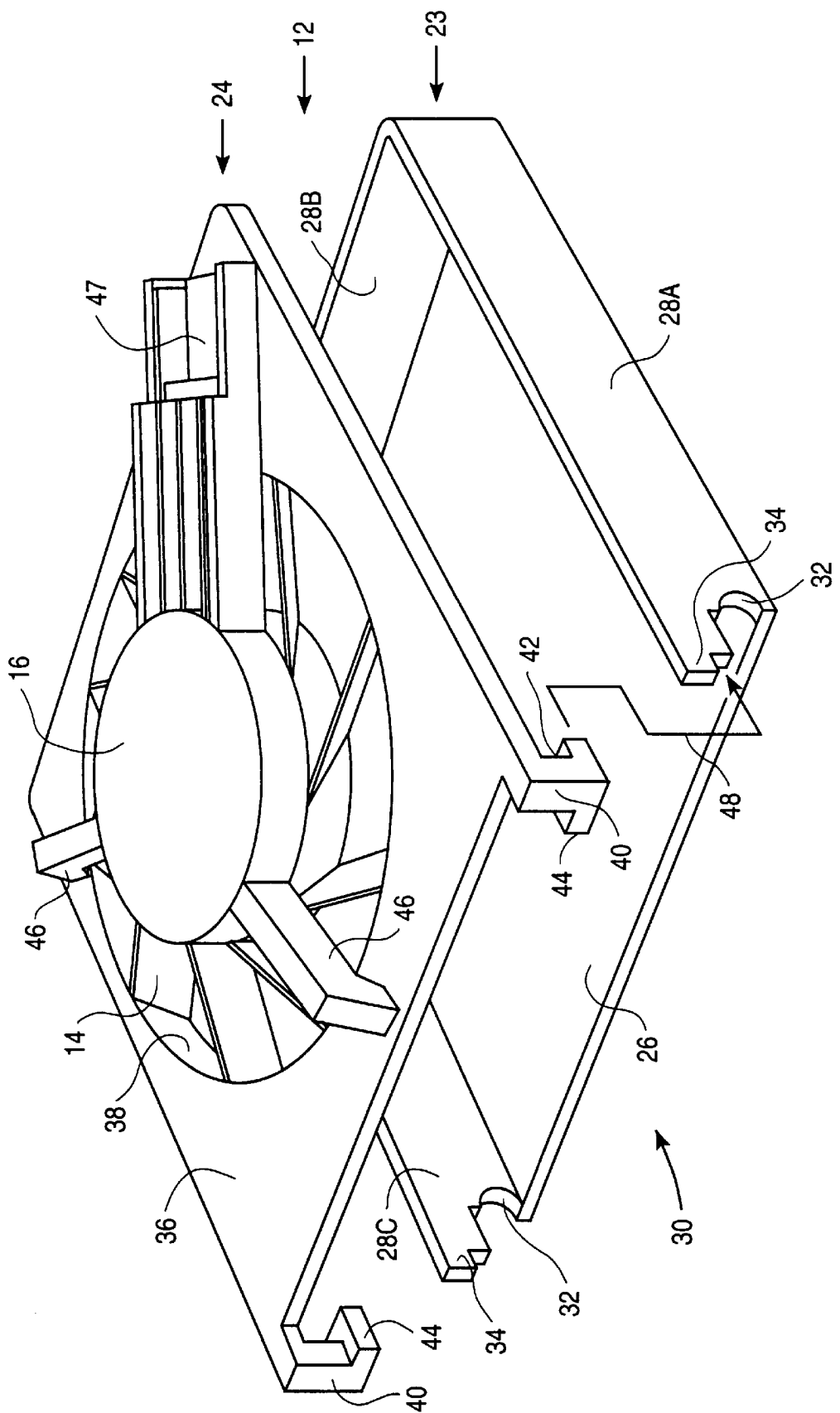
FIG. 2 is a perspective view of a body, before being fully assembled, forming part of a housing of the computer fan assembly.

FIG. 2 illustrates the body 12 before being fully assembled. The body 12 includes a lower portion 23 and an upper portion 24.

The lower portion 23 includes a rectangular base portion 26 and three side walls 28A, 28B and 28C respectively. The walls 28A, 28B and 28C extend upwardly from three respective edges of the rectangular base portion 26, thereby partially defining an enclosure with one side 30 being open. Semicircular grooves 32 are formed in the walls 28A and 28C at the open side 30 just above the rectangular base portion 26. Upper edges of the walls 28A and 28C at the open side 30 are formed with lips 34.

The upper portion 24 includes a rectangular lid 36 having a circular inlet port 38 formed therein, and alignment formations 40 extending downwardly from two corners of the rectangular lid 36. The alignment formations 40 include recesses 42 and projections 44.

The fan 14 is rotatably mounted to the electric motor 16. The electric motor 16 may have an electrical connector 47 that can be attached to a wire harness (not shown) which provides electrical power to the electric motor 16. The fan 14 is inserted through the inlet port 38 and mounted in such a position by retaining formations 46 attached to both the rectangular lid 36 and the electric motor 16. The upper portion 24 is then positioned on the lower portion 23 with the recesses 42 engaging the lips 34 in the direction of the arrow 48. By so engaging the recesses 42 with the lips 34, alignment of the upper portion 24 with respect to the lower portion 23 is ensured. Adhesive may be applied between the upper and lower portions 24 and 23 for purposes of securing them to one another.

The body 12 may be made of a conductive material such as aluminum or steel, or of a nonconductive material such as a plastics material. The components of the body 12 are typically die cast but may be made according to any other method such as machining or bending.

Figure 3:
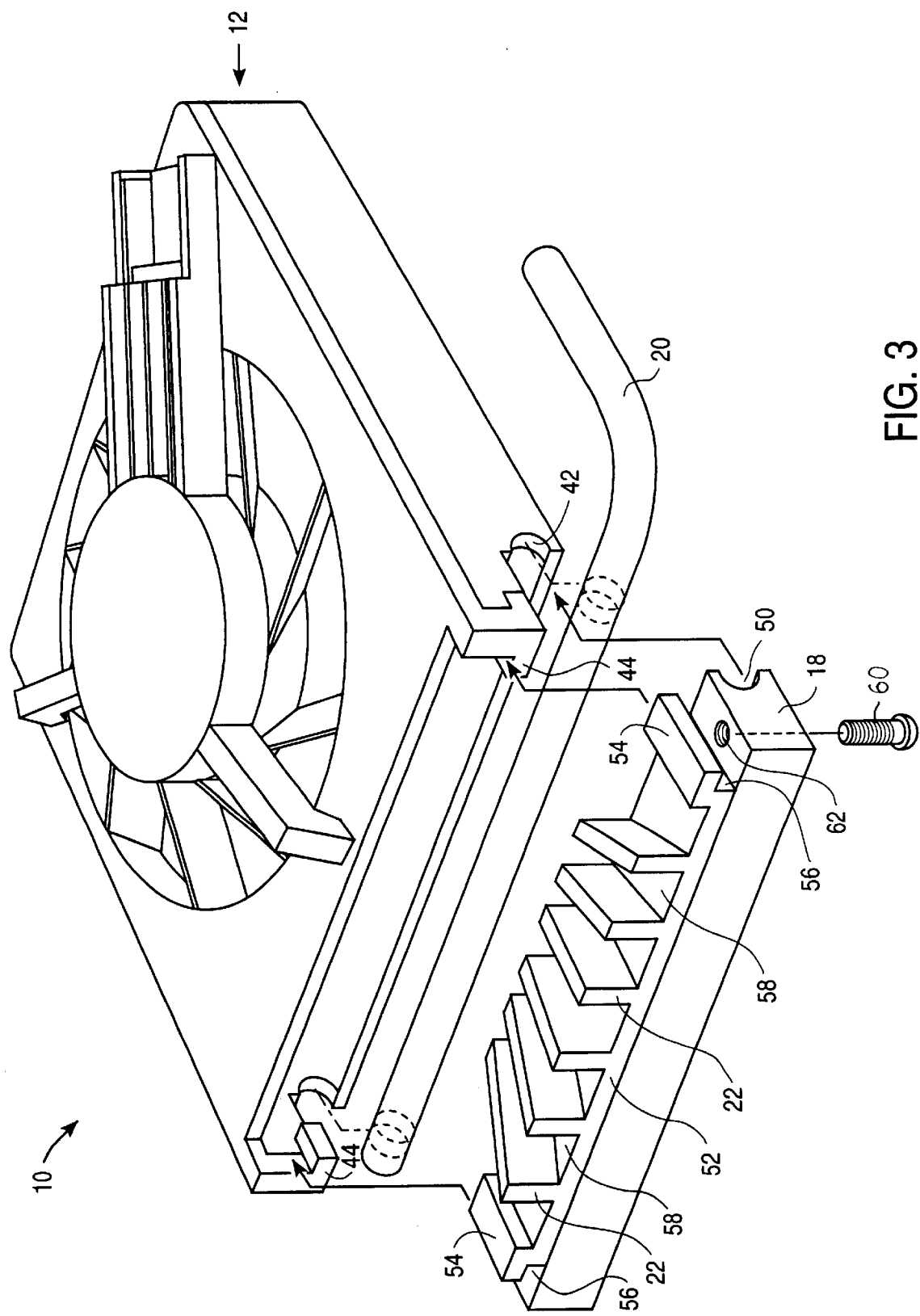
FIG. 3 is a perspective view of the computer fan assembly after the body is assembled but before a heat pipe and fins are secured to the body.

FIG. 3 illustrates the computer fan assembly 10 after the body 12 is assembled but before securing the heat pipe 20, the retaining block 18, and the plurality of fins 22 to the housing 12.

The retaining block 18 has a rectangular shape with a length more or less corresponding to the width of the body 12. A semicircular groove 50 is formed within one long edge of the retaining block 18.

The plurality of fins 22 are formed on a base plate 52. The base plate 52 is mounted, by means of an adhesive or the like, on top of the retaining block 18. Flanges 54 are formed at ends of the base plate 52 at spaced locations from the retaining block 18 so that slots 56 are defined between the flanges 54 and the retaining block 18. The fins 22 are located on the base plate 52 so that channels 58 having increasing widths are defined between the fins 22.

The retaining block 18, the base plate 52 and the fins 22 are preferably made of a material such as aluminum or steel having good thermal characteristics and may be made of the same material as the body 12.

The heat pipe 20 may be of conventional kind. One skilled in the art would appreciate that a heat pipe functions by allowing a hot medium, such as a thermal oil, to flow in a first direction through the heat pipe, allowing the medium to cool down, whereafter the medium flows under capillary action back through the heat pipe. One skilled in the art would also appreciate that, although a heat pipe having a circular cross-section is shown in the drawings, another heat pipe such as a flat heat pipe may alternatively be used.

An end portion of the heat pipe 20 is first positioned against the grooves 32 in the walls 28A and 28C. The retaining block 18 and the base plate 52 are then engaged with the body 12 with the projections 44 sliding within the slots 56 until the groove 50 in the retaining block 18 contacts a surface of the end section of the heat pipe 20. The retaining block 18 and the base plate 52 may be secured in such a position by inserting fasteners such as screws 60 through holes 62 in the retaining block 18 and holes (not shown) in the projection 44 of the upper portion 24 of the body 12. The heat pipe 20 is so secured in intimate contact with surfaces of the body 12 and the retaining block 18.

Figure 4:
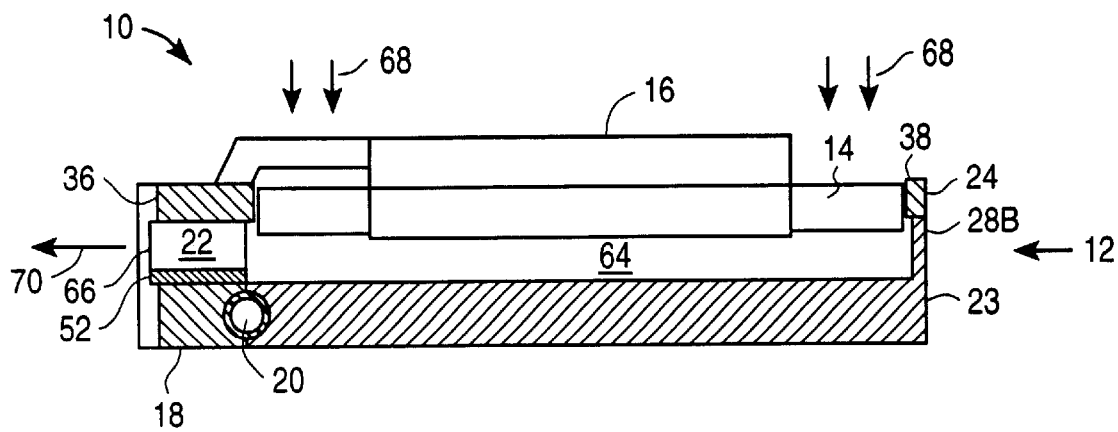
FIG. 4 is a partially sectioned side view of the computer fan assembly.

FIG. 4 is a partially sectioned side view of the fully assembled computer fan assembly 10. It can be seen that at the lower portion 23 and the upper portion 24 and the retaining block 18 jointly define a housing 64. The fan 14 is rotatably mounted within the housing 64 and the housing 64 has an inlet port 38, and an outlet port 66 which is defined between opposing surfaces of the rectangular lid 36 and the base plate 52. Upon rotation of blades of the fan 14 by the electric motor 16, air enters the housing 64 in a first direction 68 through the inlet port 38. The air then passes through the housing 64 and exits the housing in a second direction 70 through the outlet port 66. The inlet and outlet ports, 38 and 66, are positioned relative to one another so that the second direction 70 is substantially at right angles with respect to the first direction 68. In other embodiments there may be an angle of at least 30 degrees between the first and second directions 68 and 70, and preferably an angle of at least 80 degrees.

Figure 5:
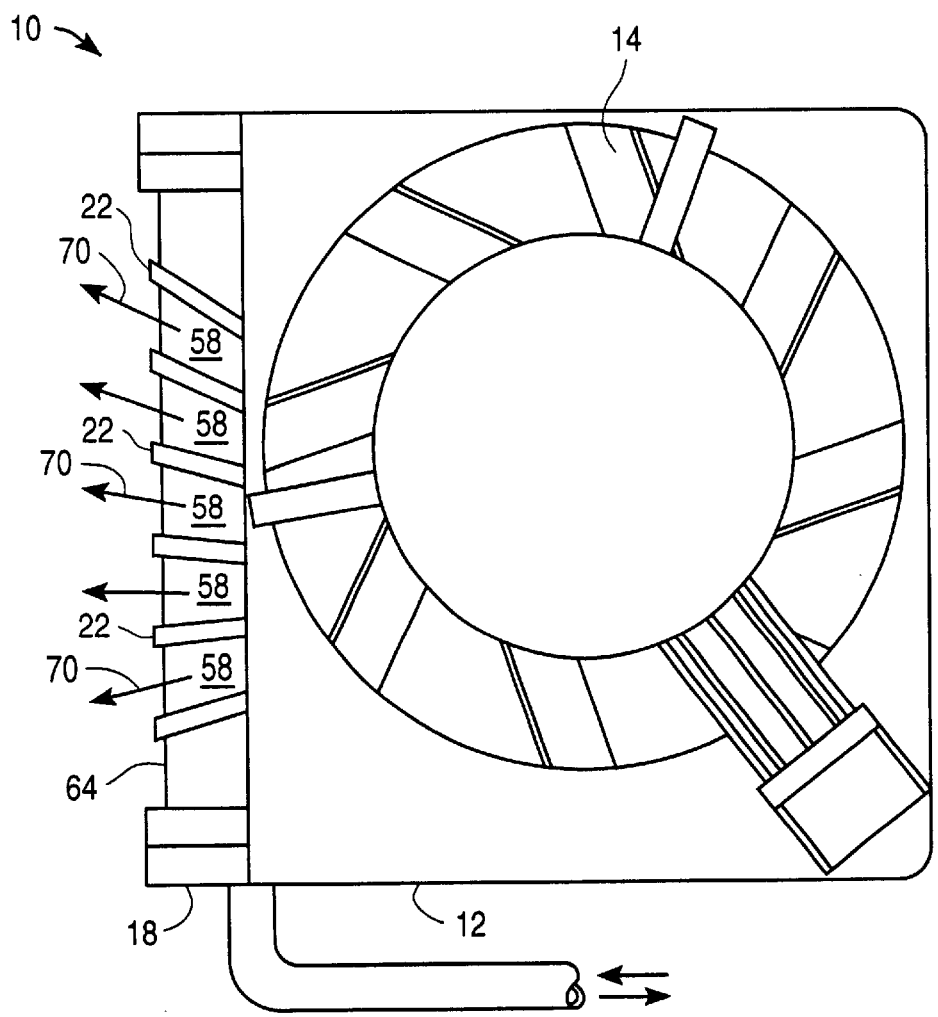
FIG. 5 is a top plan view illustrating the layout of the computer fan assembly.

FIG. 5 is an illustrative plan view of the computer fan assembly 10 showing the configuration of the fins 22 with respect to the fan 14. The fins 22 are located between the fan 14 and the outlet port 66 and are spaced further apart in distance from the fan 14 in order to conform with the direction of flow of air coming from the fan 14.

Figure 6:
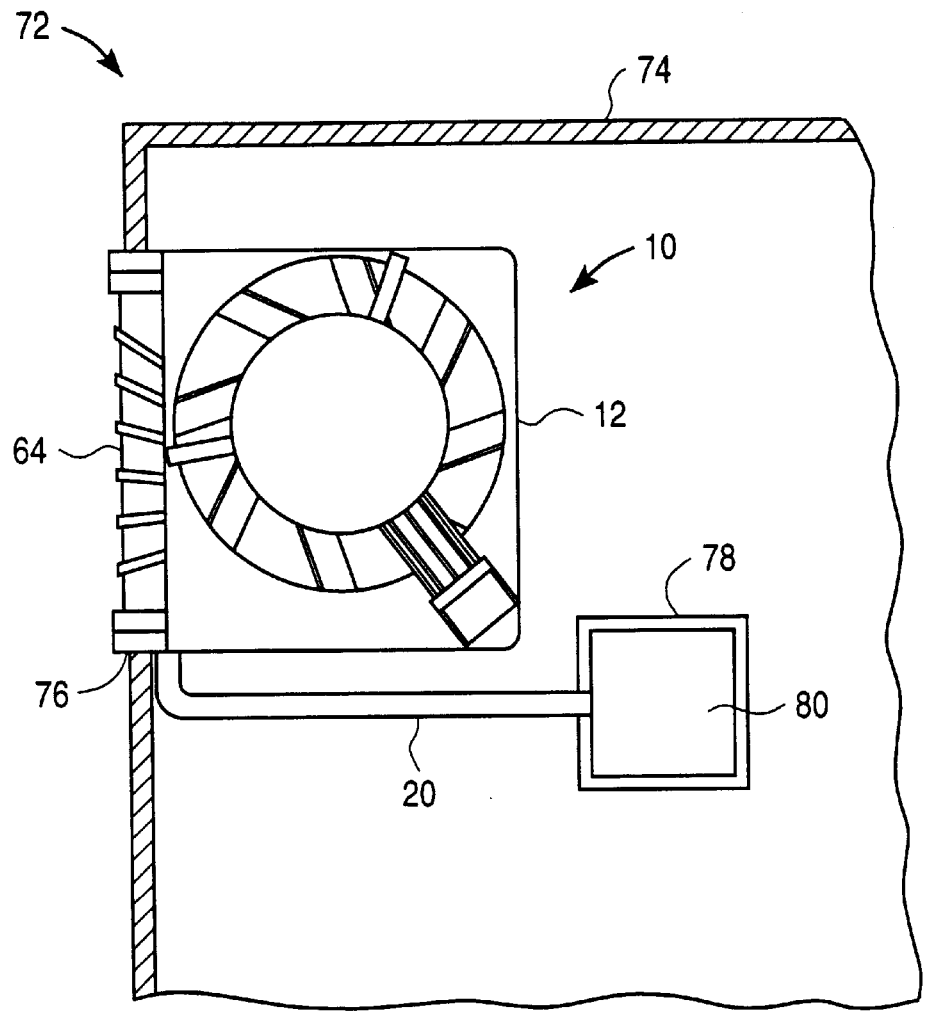
FIG. 6 is a top plan view illustrating a computer incorporating the computer fan assembly.
Figure 7:
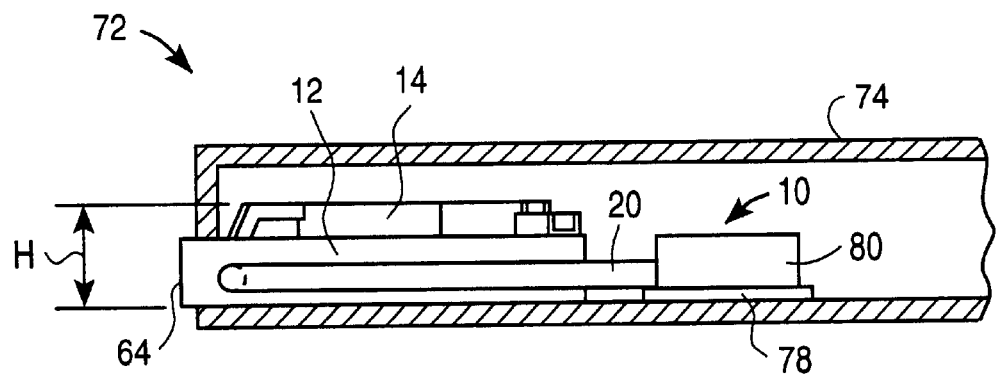
FIG. 7 is a side view illustrating the computer.

FIGS. 6 and 7 illustrate in partially sectioned views a computer 72 such as a laptop for notebook computer incorporating a computer fan assembly 10 as hereinbefore described. The computer 72 includes an enclosure 74 having an opening 76 in one wall, and a device 78 within the enclosure 74, such as a central processing unit or other device which generates heat and has to be cooled. A heat sink 80 may be located on the device 78 for purposes of transferring heat flux from the device 78. The computer fan assembly 10 is located within the enclosure 74 with the outlet port 64 positioned within the opening 76 and with the heat pipe 20 connected to the heat sink 80. In order to fit into the enclosure 74, the computer fan assembly 10 has a height H which is preferably less than 12 mm.

Heat may be conducted from the heat sink 80 through the heat pipe 20 to the retaining block 18 (refer to FIG. 1). The heat may then conduct through the retaining block 18 and the base plate 52 to the fins 22. Air circulating through the housing 64 may pass over the fins 22, resulting in transfer of heat from the fins 22 to the air. It can therefore be seen that heat can be transferred from the device 78 to the air passing through the housing 64. The computer fan assembly 10 may at the same time remove air from within the enclosure 74, thereby controlling the overall temperature of the computer 72.

Figure 8:
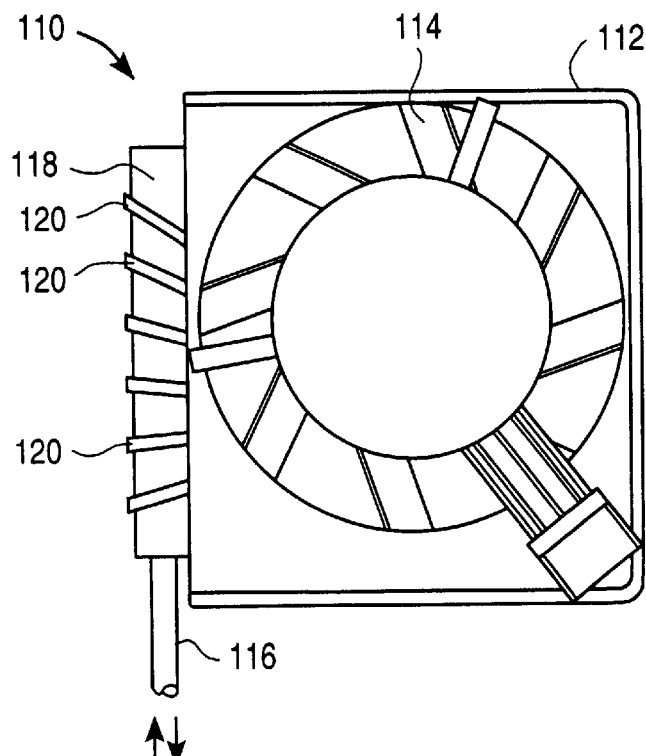
FIG. 8 is a top plan view of a computer fan assembly according to another embodiment of the invention.

FIG. 8 illustrates a computer fan assembly 110 according to another embodiment of the invention. The computer fan assembly 110 includes a housing 112 accommodating a fan 114. A heat pipe 116 extends into a separate block 118, having a number of fins 120 thereon, in an integral construction. The block 118 is then secured to the housing 112.

Figure 9:
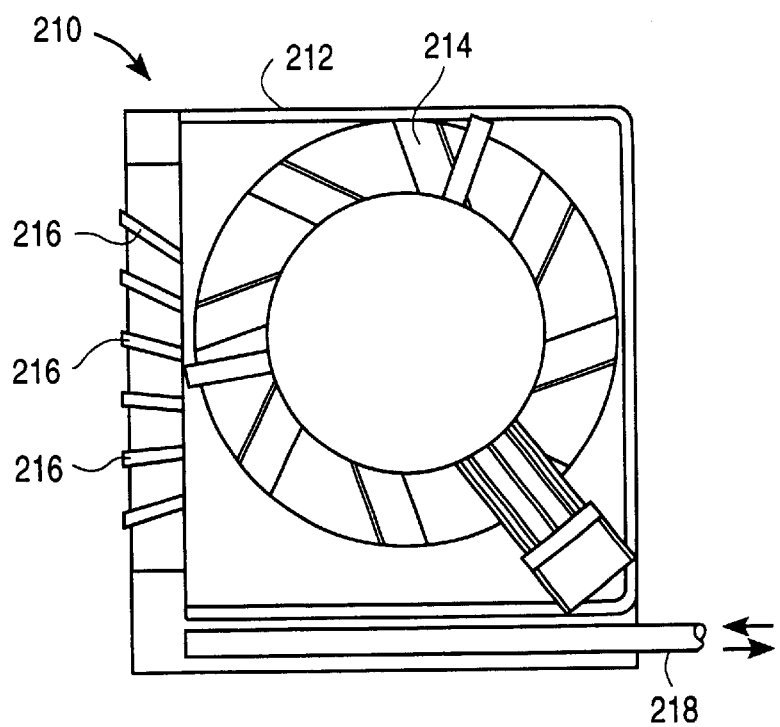
FIG. 9 is a top plan view of a computer fan assembly according to yet a further embodiment of the invention.

In the embodiments hereinbefore described the heat pipes are located near outlet ports of the respective housings. FIG. 9 illustrates a computer fan assembly 210 according to a further embodiment of the invention. The computer fan assembly 210 includes a housing 212 accommodating a fan 214. A number of fins 216 are located between the fan 214 and an outlet port of the housing 212. A heat pipe 218 is inserted into an opening in the housing 212 extending along an edge of the housing 212 which is at right angles with an edge of the housing 212 at which the fins 216 are located. Heat is transferred from the heat pipe 218 to the housing 212. The heat is then transferred from the housing 212 to the fins 216 from where heat is convected to air passing through the housing 212.

While certain exemplary embodiments have been described and shown in the accompanying drawings, it is to be understood that such embodiments are merely illustrative and not restrictive of the current invention, and that this invention is not restricted to the specific constructions and arrangements shown and described, since modifications may occur to those ordinarily skilled in the art.

What is claimed:

1. A computer comprising:
   a computer enclosure having a wall defining a computer enclosure opening;
   a heat generating device within the computer enclosure;
   a heat pipe having a first portion and a second portion, the first portion thermally connected to the heat generating device;
   a body secured within the computer enclosure, the body forming a housing, wherein the body has an inlet port into the housing and a body opening out of the housing, the heat pipe second portion being located against and in intimate contact with the body in the body opening;
   a retaining block located on a side of the heat pipe opposing the body and in intimate contact to the second portion of the heat pipe, the retaining block being secured to the body thereby securing the heat pipe to the body;

a plurality of fins secured to the retaining block in the body opening, wherein an area between the fins and the body opening defines an outlet port, the body being located in a position wherein the outlet port is adjacent the wall and mating with the computer enclosure opening;

a fan rotatably mounted to the body in the inlet port such that rotation of the fan causes air to enter the body in a first direction through the inlet port, pass through the body and exit the body in the second direction, transverse to the first direction, through the outlet port and the computer enclosure opening out of the computer enclosure, wherein when the heat generating device produces heat, the heat transfers to the first portion of the heat pipe, the heat transferring from the first portion of the heat pipe to the second portion of the heat pipe through the retaining block to the fins from where the heat is convected to the air that exits through the outlet port and the computer enclosure opening out of the computer enclosure.

2. The computer of claim 1 wherein the inlet port and the outlet port are positioned relative to one another so that, upon rotation of the fan, air enters the body in a first direction through the inlet port, and exits the body in a second direction through the outlet port, wherein the second direction is at an angle with respect to the first direction.

3. The computer of claim 2 wherein the second direction is substantially at right angles with respect to the first direction.

4. The computer of claim 1 wherein the heat pipe is secured nearer to the outlet port than to the inlet port.

5. The computer of claim 1 wherein the fins are positioned above the heating pipe.

6. The computer of claim 1 wherein the fins are located adjacent one another such that each spacing between two adjacent fins defines a channel, wherein at least one channel has a width which increases in distance from a smaller width nearer to the fan to a larger width nearer to the opening in the computer enclosure.

7. A computer comprising:

a computer enclosure having a wall defining a computer enclosure opening;

a heat generating device within the computer enclosure;

a heat pipe having a first portion and a second portion, the first portion thermally connected to the heat generating device;

a body secured within the computer enclosure, the body forming a housing, wherein the body has an inlet port into the housing and a body opening out of the housing, the heat pipe second portion being located against and in intimate contact with the body in the body opening;

a retaining block located on a side of the heat pipe opposing the body and in intimate contact to the second portion of the heat pipe so that the body and the retaining block define a retaining formation between the body and the retaining block, the retaining formation being capable of securing the heat pipe thereto, the second portion of the heat pipe being positioned inside the retaining formation;

a plurality of fins secured to the retaining block in the body opening, wherein an area between the fins and the body opening defines an outlet port, the body being located in a position wherein the outlet port is adjacent the wall and mating with the computer enclosure opening;

a fan rotatably mounted to the body in the inlet port such that rotation of the fan causes air to enter the body in a first direction through the inlet port, pass through the body, and exit the body in the second direction, transverse to the first direction, through the outlet port and the computer enclosure opening out of the computer enclosure, wherein when the heat generating device produces heat, the heat transfers to the first portion of the heat pipe, the heat transferring from the first portion of the heat pipe to the second portion of the heat pipe through the retaining block to the fins from where the heat is convected to the air that exits through the outlet port and the computer enclosure opening out of the computer enclosure.

8. The computer of claim 7 wherein the inlet port and the outlet port are positioned relative to one another so that, upon rotation of the fan, air enters the body in a first direction through the inlet port and exits the body in a second direction through the outlet port, wherein the second direction is at an angle with respect to the first direction.

* * * * *